US012660573B2

(12) United States Patent
    Carcasi et al.

(10) Patent No.:  US 12,660,573 B2
(45) Date of Patent:      Jun. 16, 2026

(54) SYSTEMS AND METHODS FOR DETERMINING A FLUID HEIGHT AND/OR A FLUID VELOCITY ON A SPINNING SUBSTRATE

(71) Applicant: Tokyo Electron Limited, Tokyo (JP)

(72) Inventors: Michael Carcasi, Austin, TX (US);
                Sean Berglund, Austin, TX (US);
                Ankur Agarwal, Austin, TX (US);
                Joshua Hooge, Austin, TX (US); David Hetzer, Albany, NY (US); Robert Brandt, Albany, NY (US); Steven Gueci, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 404 days.

(21) Appl. No.: 18/210,773

(22) Filed: Jun. 16, 2023

(65) Prior Publication Data

US 2024/0421009 A1     Dec. 19, 2024

(51) Int. Cl.
     *H10P 74/00*      (2026.01)
     *G01B 11/22*      (2006.01)
     *G01P 5/26*       (2006.01)

(52) U.S. Cl.
     CPC .............. *H10P 74/238* (2026.01); *G01P 5/26* (2013.01); *G01B 11/22* (2013.01)

(58) Field of Classification Search
     CPC ....................................................... G01P 5/26
     See application file for complete search history.

(56) References Cited

U.S. PATENT DOCUMENTS

| | | | |
|---|---|---|---|
| 6,558,964 B2 * | 5/2003 | Treur | ................ H01L 21/67253 |
| | | | 438/782 |
| 10,048,587 B2 | 8/2018 | Carcasi et al. | |
| 2020/0338510 A1 | 10/2020 | Nasman et al. | |

OTHER PUBLICATIONS

Korzhova, "Motion Analysis of Fluid Flow in a Spinning Disk Reactor," 2009, Scholar Commons, University of South Florida. (Year: 2009).*

Korzhova et al., "Reconstructing Experimental Data from Video Records for Film over a Spinning Disk", 2010, V European Conference of Computational Fluid Dynamics, pp. 1-11. (Year: 2010).*

(Continued)

*Primary Examiner* — Robert A Vetere
(74) *Attorney, Agent, or Firm* — Egan, Enders & Huston LLP.

(57) ABSTRACT

Embodiments of processing systems and methods are provided to control operational parameter(s) of a spin-on process based on a fluid height and/or a fluid velocity of a processing liquid dispensed onto a surface of a spinning semiconductor substrate. The disclosed embodiments determine the fluid height and/or the fluid velocity of the processing liquid by: (a) monitoring an intensity of light, which is transmitted through the processing liquid as the processing liquid flows across the surface of the spinning substrate or leaves the periphery of the spinning substrate, or (b) monitoring how long it takes for the processing liquid to flow from a dispensed location to the periphery of the spinning substrate. Once determined, the fluid velocity is used to control one or more operational parameters of a spin-on process.

20 Claims, 8 Drawing Sheets

(56) References Cited

OTHER PUBLICATIONS

Kim et al., "The Flow and Hydrodynamic Stability of a Liquid Film on a Rotating Disc", IOP Publishing, Fluid Dynamics Research, 2009, 30 pgs.

Korzhova, "Motion Analysis of Fluid Flow in a Spinning Disk Reactor", Scholar Commons, University of South Florida, 2009, 96 pgs.

Korzhova, "Tracking Fluid Flow in a Spinning Disk Reactor", Scholar Commons, University of South Florida, 2006, 43 pgs.

Sisoev et al., "Stationary Spiral Waves in Film Flow Over a Spinning Disk", Physics of Fluid, 2010, 7 pgs.

* cited by examiner

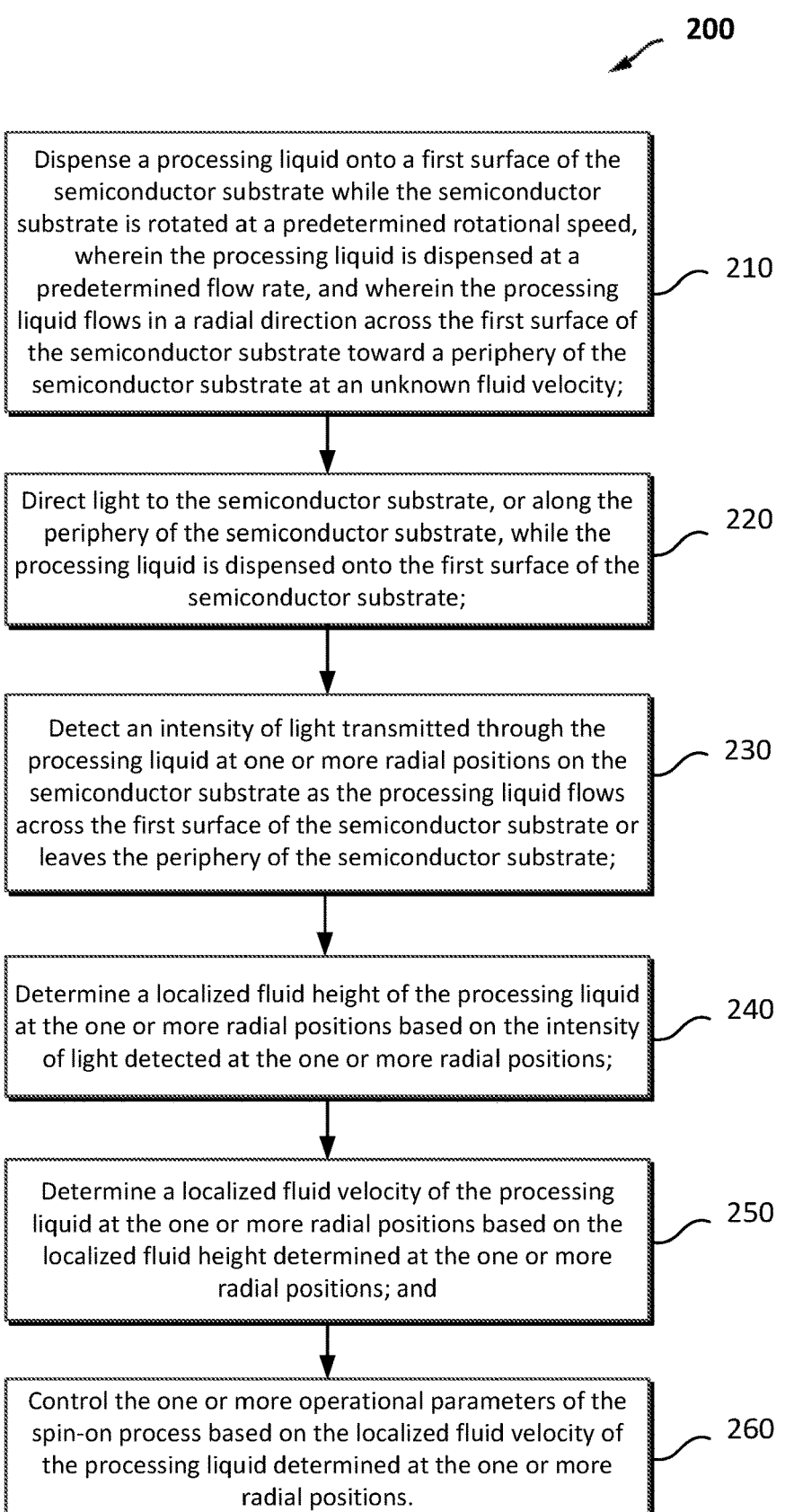

200

Dispense a processing liquid onto a first surface of the semiconductor substrate while the semiconductor substrate is rotated at a predetermined rotational speed, wherein the processing liquid is dispensed at a predetermined flow rate, and wherein the processing liquid flows in a radial direction across the first surface of the semiconductor substrate toward a periphery of the semiconductor substrate at an unknown fluid velocity;     210

Direct light to the semiconductor substrate, or along the periphery of the semiconductor substrate, while the processing liquid is dispensed onto the first surface of the semiconductor substrate;     220

Detect an intensity of light transmitted through the processing liquid at one or more radial positions on the semiconductor substrate as the processing liquid flows across the first surface of the semiconductor substrate or leaves the periphery of the semiconductor substrate;     230

Determine a localized fluid height of the processing liquid at the one or more radial positions based on the intensity of light detected at the one or more radial positions;     240

Determine a localized fluid velocity of the processing liquid at the one or more radial positions based on the localized fluid height determined at the one or more radial positions; and     250

Control the one or more operational parameters of the spin-on process based on the localized fluid velocity of the processing liquid determined at the one or more radial positions.     260

Dispense a processing liquid onto a dispensed location on the surface of the semiconductor substrate while the semiconductor substrate is rotated at a predetermined rotational speed, wherein the processing liquid is dispensed at a predetermined flow rate, and wherein the processing liquid flows from the dispensed location in a radial direction across the surface of the semiconductor substrate toward a periphery of the semiconductor substrate at an unknown fluid velocity;                   610

Monitor a sensor output signal obtained from a sensor, which is positioned adjacent to the periphery of the semiconductor substrate and perpendicular to the processing liquid as it flows in the radial direction across the surface of the semiconductor substrate toward the periphery of the semiconductor substrate;                   620

Determine an amount of time it takes for the processing liquid to flow from the dispensed location to the periphery of the semiconductor substrate based on the sensor output signal;                   630

Determine an average fluid velocity of the processing liquid across the surface of the semiconductor substrate based on the amount of time it takes for the processing liquid to flow from the dispensed location to the periphery of the semiconductor substrate; and                   640

Control the one or more operational parameters of the spin-on process based on the average fluid velocity of the processing liquid.                   650

*FIG. 6*

SYSTEMS AND METHODS FOR DETERMINING A FLUID HEIGHT AND/OR A FLUID VELOCITY ON A SPINNING SUBSTRATE

RELATED ART

The present disclosure is related to co-pending U.S. patent application Ser. No. 18/210,772, entitled "Systems and Methods for Determining a Localized Fluid Velocity of a Processing Liquid Dispensed on a Spinning Substrate by Tracking Movement of an Induced Perturbation in the Processing Liquid Across the Spinning Substrate" and co-pending U.S. patent application Ser. No. 18/210,762, entitled "Systems and Methods for Determining a Localized Fluid Velocity on a Spinning Substrate by Tracking Movement of a Tracer Across the Spinning Substrate", each of which is filed concurrently on Jun. 16, 2023 and incorporated by reference herein.

BACKGROUND

The present disclosure relates to the processing of semiconductor substrates. In particular, the present disclosure relates to systems and methods for determining a fluid velocity of a processing fluid dispensed onto a spinning substrate.

Semiconductor fabrication processes may involve a wide variety of processing steps, including depositing, growing, patterning, etching, coating, developing and cleaning steps. Some of these processing steps may be spin-on processes, which are performed on a semiconductor substrate while the semiconductor substrate is disposed within a processing chamber having a spin chuck and at least one liquid dispense nozzle.

FIG. 1 illustrates one example of a processing chamber 100 having a spin chuck 110 and at least one liquid dispense nozzle 120. In a conventional spin-on process, a semiconductor substrate (or wafer W) to be processed is positioned on a spin chuck 110 and held in place, for example, by vacuum pressure or mechanical pin holders. During various processing steps, the spin chuck 110 and the semiconductor substrate W mounted thereon are rotated by a drive mechanism 115, which may be a stepper motor, etc. The drive mechanism 115 causes the spin chuck 110 to spin at a variety of rotational speeds during the application and flow of a liquid material onto a surface of the semiconductor substrate W.

In the processing chamber 100 shown in FIG. 1, a cup 130 is provided to capture processing liquids that are ejected or fall from the surface of the semiconductor substrate W. The spin chuck 110 and drive mechanism 115 are disposed within an opening in the cup 130. The spin chuck 110 supports and rotates (i.e., spins) the semiconductor substrate W about its central normal axis relative to the cup 130, which is stationary. As the spin chuck 110 rotates, the cup 130 captures and collects a majority of the processing liquid, which is ejected from the surface of the semiconductor substrate W by the centrifugal forces generated during rotation of the spin chuck 110. The liquid collected by the cup 130 is drained via a drain line 135 and drain unit (not shown). An exhaust line 137 and exhaust unit (not shown), such as a vacuum pump or other negative pressure-generating device, may also be provided within the processing chamber 100 to remove gaseous species (including but not limited to vapors released from substrate layers during processing) from the processing space inside the cup 130.

The at least one nozzle 120 is coupled to a liquid supply unit (not shown) through a liquid supply line 125 for dispensing a variety of processing liquids (L) onto the surface of the semiconductor substrate W. The processing liquid(s) supplied to the substrate surface may generally depend on the processing step(s) being performed. For example, the nozzle 120 may dispense a processing liquid onto the surface of the semiconductor substrate W to coat the substrate surface and form a layer of material (for example, a metal layer, a dielectric layer, a photoresist, etc.) on the substrate surface. In some cases, a patterning layer may be formed over the material layer and the material layer may be subsequently etched by dispensing an etchant chemical from the nozzle 120 onto the patterning layer. In another example, the nozzle 120 may dispense a develop solution onto the surface of the semiconductor substrate W to develop a layer previously deposited (for example, a photoresist layer) on the substrate surface. In yet other examples, the nozzle 120 may dispense a cleaning chemical and/or a rinse solvent onto the surface of the semiconductor substrate W to clean and/or rinse the substrate surface.

In spin-on processes, processing liquid(s) are dispensed onto the surface of the semiconductor substrate W while spin chuck 110 spins the substrate W at one or more specified rotational speeds. The processing liquid(s) may be dispensed in accordance with a predetermined process recipe. In some spin-on processes, for example, nozzle 120 may dispense a given processing liquid onto the substrate surface at a predetermined flow rate from one or more fixed locations while the substrate rotates at a predetermined rotation speed. In other spin-on processes, nozzle 120 may be scanned across the substrate surface at a specified scan rate while dispensing a given processing liquid onto the spinning substrate surface at a specified flow rate.

In some cases, the local fluid dynamics of a processing liquid dispensed onto a spinning substrate may adversely affect the local area performance of the substrate. For example, the local fluid dynamics introduced during a spin-on process may adversely affect critical dimensions on a patterned substrate, cause pattern collapse, etc. Thus, it would be beneficial to take local fluid dynamics into account when developing and/or optimizing a process recipe for a spin-on process.

SUMMARY

The present disclosure provides various embodiments of processing systems and methods that avoid adverse local fluid dynamic effects on a patterned substrate during a spin-on process. More specifically, the present disclosure provides embodiments of improved processing systems and methods that control operational parameter(s) of a spin-on process based on a fluid velocity and/or a fluid height of a processing liquid dispensed onto a surface of a spinning semiconductor substrate.

In some embodiments, the processing systems and methods disclosed herein may determine a localized fluid height and a localized fluid velocity of the processing liquid by monitoring an intensity of light, which is transmitted through the processing liquid as the processing liquid flows across the surface of the spinning substrate or leaves the periphery of the spinning substrate. In other embodiments, the processing systems and methods disclosed herein may determine an average fluid velocity of the processing liquid by monitoring how long it takes for the processing liquid to flow from a dispensed location to the periphery of the spinning substrate. Once a fluid velocity is determined, the fluid velocity can be used to control operational parameter(s) of a spin-on process currently in progress or subsequently performed. By controlling the operational parameter(s) of the spin-process based on fluid velocity, the embodiments disclosed herein avoid the local fluid dynamic effects that tend to adversely affect the local area performance of patterned substrates during conventional spin-on processes.

According to one embodiment, a method is provided herein for controlling one or more operational parameters of a spin-on process used to dispense a processing liquid onto a surface of a semiconductor substrate. In some embodiments, the method may begin by dispensing the processing liquid onto a first surface of the semiconductor substrate while the semiconductor substrate is rotated at a predetermined rotational speed. Although the processing liquid is dispensed at a predetermined flow rate, the processing liquid flows in a radial direction across the first surface of the semiconductor substrate toward a periphery of the semiconductor substrate at an unknown fluid velocity. The method may further include directing light to the semiconductor substrate, or along the periphery of the semiconductor substrate, while the processing liquid is dispensed onto the first surface of the semiconductor substrate, and detecting an intensity of light transmitted through the processing liquid at one or more radial positions on the semiconductor substrate as the processing liquid flows across the first surface of the semiconductor substrate or leaves the periphery of the semiconductor substrate. The method may further include determining a localized fluid height of the processing liquid at the one or more radial positions based on the intensity of light detected at the one or more radial positions, and determining a localized fluid velocity of the processing liquid at the one or more radial positions based on the localized fluid height determined at the one or more radial positions.

After the localized fluid velocity of the processing liquid is determined, the method may control one or more operational parameters of the spin-on process based on the localized fluid velocity of the processing liquid determined at the one or more radial positions. A wide variety of operational parameters may be controlled based on the localized fluid velocity of the processing liquid determined at the one or more radial positions. For example, the method may control: the predetermined rotational speed at which the semiconductor substrate is rotated, the predetermined flow rate at which the processing liquid is dispensed, a position of a nozzle dispensing the processing liquid and/or a scan rate of the nozzle.

The present disclosure contemplates directing a wide variety of light sources to the semiconductor substrate and detecting a wide variety of light in return. In some embodiments, for example, the method may direct an excitation wavelength of the light to at least a portion of the first surface of the semiconductor substrate, wherein the excitation wavelength excites a material on the first surface of the semiconductor substrate which causes the material to produce photoluminescence. In such embodiments, the method may detect an intensity of the photoluminescence, which is produced by the material and transmitted through the processing liquid at the one or more radial positions on the semiconductor substrate as the processing liquid flows across the first surface of the semiconductor substrate.

In other embodiments, the method may direct short wave infrared (SWIR) light to at least a portion of a second surface of the semiconductor substrate, which opposes the first surface of the semiconductor substrate. The SWIR light may include a range of wavelengths that is transmitted through the semiconductor substrate and absorbed by the processing liquid. In such embodiments, the method may detect an intensity of the SWIR light, which is transmitted through the semiconductor substrate and the processing liquid at the one or more radial positions on the semiconductor substrate as the processing liquid flows across the first surface of the semiconductor substrate.

In further embodiments, the method may direct a focused beam of light along the periphery of the semiconductor substrate, wherein the focused beam of light is directed perpendicular to the processing liquid as it flows in the radial direction across the first surface of the semiconductor substrate toward the periphery of the semiconductor substrate. In such embodiments, the method may detect an intensity of the focused beam of light that is transmitted through the processing liquid as the processing liquid leaves the periphery of the semiconductor substrate.

In some embodiments, the method may determine the localized fluid height of the processing liquid by: (a) monitoring the intensity of light transmitted through the processing liquid at the one or more radial positions on the semiconductor substrate, as the processing liquid flows across the first surface of the semiconductor substrate and leaves the periphery of the semiconductor substrate; (b) detecting a difference in the intensity of light transmitted through the processing liquid at a given radial position on the semiconductor substrate, wherein the difference in the intensity of light corresponds to the localized fluid height of the processing liquid at the given radial position; and (c) utilizing the difference in the intensity of light to calculate the localized fluid height of the processing liquid at the given radial position.

In some embodiments, the method may determine a first localized fluid height of the processing liquid at a first radial position based on an intensity of light detected at the first radial position, and a second localized fluid height of the processing liquid at a second radial position based on an intensity of light detected at the second radial position. In some embodiments, the method may determine the localized fluid velocity of the processing liquid by: (a) using the first localized fluid height and the second localized fluid height to determine a volumetric change in the processing liquid that occurs over time between the first radial position and the second radial position; and (b) determining the localized fluid velocity of the processing liquid between the first radial position and the second radial position that produces the volumetric change in the process liquid.

According to yet another embodiment, another method is provided herein for controlling one or more operational parameters of a spin-on process used to dispense a processing liquid onto a surface of a semiconductor substrate. Like the previous embodiment, the method may generally begin by dispensing the processing liquid onto a dispensed location on the surface of the semiconductor substrate while the semiconductor substrate is rotated at a predetermined rotational speed. Although the processing liquid is dispensed at a predetermined flow rate, the processing liquid flows from the dispensed location in a radial direction across the surface of the semiconductor substrate toward a periphery of the semiconductor substrate at an unknown fluid velocity.

Unlike the previous embodiment, the method may further include: (a) monitoring a sensor output signal obtained from a sensor, which is positioned adjacent to the periphery of the semiconductor substrate and perpendicular to the processing liquid as it flows in the radial direction across the surface of the semiconductor substrate toward the periphery of the semiconductor substrate; (b) determining an amount of time it takes for the processing liquid to flow from the dispensed location to the periphery of the semiconductor substrate based on the sensor output signal; and (c) determining an average fluid velocity of the processing liquid across the surface of the semiconductor substrate based on the amount of time it takes for the processing liquid to flow from the dispensed location to the periphery of the semiconductor substrate.

After the average fluid velocity of the processing liquid is determined, the method may control the one or more operational parameters of the spin-on process based on the average fluid velocity of the processing liquid. A wide variety of operational parameters may be controlled based on the average fluid velocity of the processing liquid determined across the surface of the semiconductor substrate. For example, the method may control: the predetermined rotational speed at which the semiconductor substrate is rotated, the predetermined flow rate at which the processing liquid is dispensed, a position of a nozzle dispensing the processing liquid and/or a scan rate of the nozzle.

In some embodiments, the method may further include directing a focused beam of light along the periphery of the semiconductor substrate, wherein the focused beam of light is directed perpendicular to the processing liquid as it flows in the radial direction across the surface of the semiconductor substrate toward the periphery of the semiconductor substrate. In such embodiments, the sensor may an optical sensor, which is coupled to detect an intensity of the focused beam of light and generate the sensor output signal in response thereto.

When an optical sensor is utilized, the method may monitor the sensor output signal generated by the optical sensor over time as the processing liquid flows from the dispensed location in the radial direction across the surface of the semiconductor substrate toward the periphery of the semiconductor substrate, and may detect a change in the sensor output signal when the processing liquid leaves the periphery of the semiconductor substrate. The method may then determine the amount of time it takes for the processing liquid to flow from the dispensed location to the periphery of the semiconductor substrate based on the sensor output signal by determining the amount of time between an initial dispensing of the processing liquid and detecting the change in the sensor output signal. In some embodiments, the method may determine the average fluid velocity of the processing liquid across the surface of the semiconductor substrate by determining the average fluid velocity of the processing liquid across the surface of the semiconductor substrate based on the predetermined rotational speed, the predetermined flow rate and the amount of time it takes for the processing liquid to flow from the dispensed location to the periphery of the semiconductor substrate.

In other embodiments, the sensor may be a pressure sensor, which is coupled to detect a pressure of the processing liquid when the processing liquid leaves the periphery of the semiconductor substrate and generate the sensor output signal in response thereto.

When a pressure sensor is utilized, the method may monitor the sensor output signal generated by the pressure sensor over time as the processing liquid flows from the dispensed location in the radial direction across the surface of the semiconductor substrate toward the periphery of the semiconductor substrate, and may detect a change in the sensor output signal when the processing liquid leaves the periphery of the semiconductor substrate. The method may then determine the amount of time it takes for the processing liquid to flow from the dispensed location to the periphery of the semiconductor substrate based on the sensor output signal by determining the amount of time between an initial dispensing of the processing liquid and detecting the change in the sensor output signal. In some embodiments, the method may determine the average fluid velocity of the processing liquid across the surface of the semiconductor substrate based on the predetermined rotational speed, the predetermined flow rate and the pressure of the processing liquid detected by the pressure sensor when the processing liquid leaves the periphery of the semiconductor substrate. In some embodiments, the method may further include determining a fluid height of the processing liquid when the processing liquid leaves the periphery of the semiconductor substrate by determining a number of vertical pixels of the pressure sensor that detect the pressure of the processing liquid.

Various embodiments of systems and methods are provided herein for processing a semiconductor substrate, and more specifically, for controlling operational parameter(s) of a spin-on process used to process a spinning semiconductor substrate based on a localized or average fluid velocity of a processing liquid dispensed onto a surface of the spinning semiconductor substrate. Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed inventions. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 2 is a flowchart diagram illustrating one embodiment of a method in accordance with the present disclosure;

FIG. 6 is a flowchart diagram illustrating another embodiment of a method in accordance with the present disclosure;

DETAILED DESCRIPTION

Figure 1:
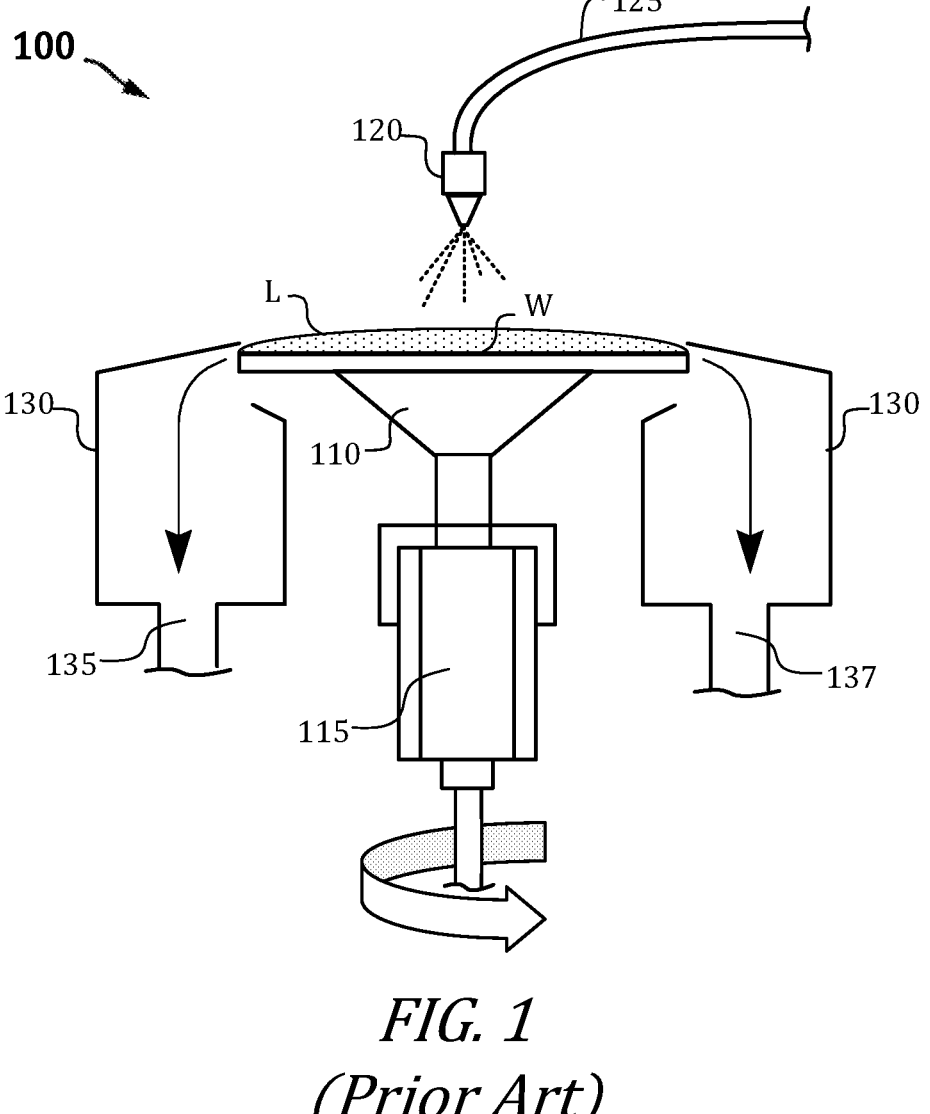
FIG. 1 (PRIOR ART) illustrates an interior of an example processing chamber having at least one nozzle for dispensing a processing liquid onto a surface of a spinning semiconductor substrate (W) during a spin-on process.

Spin-on processes are commonly used to dispense processing liquid(s) onto a surface of a semiconductor substrate while the substrate is rotating or spinning at a given rotational speed. In spin-on processes, processing liquid(s) are dispensed from one or more nozzles onto the spinning substrate surface. The nozzle(s) may be fixed or movable and can be positioned above and/or below the substrate surface, depending on the surface(s) desired to be coated with the processing liquid.

As noted above, the local fluid dynamics of a processing liquid dispensed onto a spinning substrate may adversely affect the local area performance of the substrate. For example, the local fluid dynamics introduced during a conventional spin-on process may adversely affect critical dimensions on a patterned substrate, cause pattern collapse, etc. These local fluid dynamic effects may arise, for example, from the pattern orientation relative to the radial liquid front, the pattern height and/or the process recipe used to perform the spin-on process (for example, the flow rate of the processing liquid dispensed onto the substrate, the rotational speed of the spin chuck, the scan rate or scan position of the nozzle, etc.).

Various embodiments of processing systems and methods are provided in the present disclosure to avoid the adverse local fluid dynamic effects that occur on patterned substrates during conventional spin-on processes. More specifically, the present disclosure provides embodiments of improved processing systems and methods that control operational parameter(s) of a spin-on process based on a fluid height and/or a fluid velocity of a processing liquid, which is dispensed onto a surface of a spinning semiconductor substrate.

In some embodiments, the processing systems and methods disclosed herein may determine a localized fluid height and a localized fluid velocity of the processing liquid by monitoring an intensity of light, which is transmitted through the processing liquid as the processing liquid flows across the surface of the spinning substrate or leaves the periphery of the spinning substrate. In other embodiments, the processing systems and methods disclosed herein may determine an average fluid velocity of the processing liquid by monitoring how long it takes for the processing liquid to flow from a dispensed location to the periphery of the spinning substrate. Once determined, the localized or average fluid velocity can be used to control operational parameter(s) of a spin-on process currently in progress or subsequently performed. By controlling the operational parameter(s) of the spin-process based on fluid velocity, the embodiments disclosed herein avoid the local fluid dynamic effects that tend to adversely affect the local area performance of patterned substrates during conventional spin-on processes.

Turning now to the Drawings, FIG. 2 illustrates one embodiment of a method 200 in accordance with the present disclosure. The method 200 shown in FIG. 2 can be used to determine a localized fluid height and a localized fluid velocity of a processing liquid dispensed onto a surface of a spinning semiconductor substrate and control operational parameters of a spin-on process based on the localized fluid velocity. As described in more detail below, method 200 may determine the localized fluid height and the localized fluid velocity of the processing liquid by monitoring an intensity of light, which is transmitted through the processing liquid as the processing liquid flows across the surface of the spinning substrate or leaves the periphery of the spinning substrate.

The method 200 shown in FIG. 2 may determine the localized fluid velocity offline during a testing phase, or dynamically while performing a spin-on process to process a semiconductor substrate. In some embodiments, the localized fluid velocity is determined during an initial testing phase to determine an optimum process recipe for processing a semiconductor substrate during a subsequently performed spin-on process. In other embodiments, the localized fluid velocity is determined dynamically during a spin-on process and used to adjust the process recipe in real-time as the semiconductor substrate is being processed.

In some embodiments, the method 200 may begin (in step 210) by dispensing a processing liquid onto a first surface of a semiconductor substrate while the semiconductor substrate is rotated at a predetermined rotational speed (for example, a rotational speed within a range of 200 to 3000 rotations per minute, RPM). Although the processing liquid is dispensed onto the substrate surface at a predetermined flow rate, the rate (or "fluid velocity") with which the processing liquid flows radially across the surface of the spinning substrate is dependent on characteristics of the processing liquid (for example, the viscosity of the processing liquid), characteristics of the substrate (for example, a patterned vs. unpatterned substrate, the pattern orientation and pattern height of a patterned substrate, etc.) and characteristics of the spin-on process (for example, the flow rate of the processing liquid dispensed onto the substrate, the rotational speed of the spin chuck, the scan rate or scan position of the nozzle, etc.). As a consequence, the processing liquid dispensed onto the substrate surface (in step 210) flows in a radial direction across the first surface of the semiconductor substrate toward a periphery of the semiconductor substrate at an unknown fluid velocity.

In step 220, the method 200 directs light to the semiconductor substrate, or along the periphery of the semiconductor substrate, while the processing liquid is dispensed onto the surface of the semiconductor substrate. In response to the light provided in step 220, the method 200 detects an intensity of light, which is transmitted through the processing liquid at one or more radial positions on the semiconductor substrate as the processing liquid flows across the first surface of the semiconductor substrate or leaves the periphery of the semiconductor substrate (in step 230). The light detected in step 230 can be emitted from the semiconductor substrate as photoluminescence, transmitted through from the semiconductor substrate as transmitted light, or passed through the processing liquid ejected from the periphery of the semiconductor substrate. In response to the light detected in step 230, the method 200 determines a localized fluid height of the processing liquid at the one or more radial positions based on the intensity of light detected (in step 240). A wide variety of methods may be used to determine the localized fluid height of the processing liquid based on the intensity of light detected (in step 240).

In some embodiments, the method 200 may direct one or more excitation wavelengths of light to at least a portion of the first surface of the semiconductor substrate (in step 220) to excite a material on the substrate surface and cause the material to luminesce. The excitation wavelength(s) utilized in step 220 are generally selected based on the material being excited. For example, one exemplary photoresist material is known to produce photoluminescence around 460 nanometers (nm) when excited at an excitation wavelength of 365 nm. Other semiconductor materials (including, but not limited to, other photoresist materials) are known to produce photoluminescence at other excitation wavelengths. In some embodiments, fluorescent dyes can be added to the material matrix to increase the photoluminescent intensity produced by the material and emitted from the substrate surface.

The photoluminescence emitted from the substrate surface is transmitted through the processing liquid and detected in step 230. In some embodiments, the method 200 may detect photoluminescence before and after the processing liquid is dispensed onto the first surface of the semiconductor substrate (in step 210) to determine the amount of photoluminescent intensity that is transmitted through the processing liquid and detected (in step 230). For example, the method 200 may detect photoluminescence: (a) before the processing liquid is dispensed in step 210 to obtain baseline values of intensity, which are produced by the material at the one or more radial positions on the semiconductor substrate, and (b) while the processing liquid is dispensed in step 210 to obtain dynamic values of intensity, which are produced by the material and transmitted through the processing liquid at the one or more radial positions as the processing liquid flows across the first surface of the semiconductor substrate. The difference between the baseline and dynamic values of intensity at the radial position(s) can be used in step 240 to determine the localized fluid height of the processing liquid at the radial position(s), as discussed in more detail below.

In other embodiments, the method 200 may direct short wave infrared (SWIR) light to at least a portion of a second surface of the semiconductor substrate, which opposes the first surface of the semiconductor substrate (in step 220). SWIR light includes a range of SWIR wavelengths between approximately 1-3 μm that are primarily transmitted through the semiconductor substrate and absorbed by the processing liquid. In some embodiments, the SWIR wavelength(s) directed to the second surface of the semiconductor substrate in step 220 can be selected based on the processing liquid dispensed onto the first surface of the semiconductor substrate in step 210 and/or the chemical species included within the processing liquid.

The SWIR light transmitted through the semiconductor substrate and the processing liquid is detected in step 230. Given the relatively high transmittance and low absorbance of substrate materials (such as silicon) in the SWIR wavelength range, the localized fluid height of the processing liquid can be determined in step 240 by choosing SWIR wavelength(s) that are primarily absorbed by the processing liquid and/or the chemical species contained therein. Because SWIR wavelength(s) are absorbed primarily by the processing liquid, and not the substrate material(s), the difference between the intensity of the SWIR light directed to the substrate in step 210 and the intensity of the SWIR light detected in step 230 can be used to determine the localized fluid height of the processing liquid at the radial position(s), as discussed in more detail below.

In yet other embodiments, the method 200 may direct a focused beam of light (for example, a visible wavelength laser beam) along the periphery of the semiconductor substrate (in step 220). The focused beam of light is directed perpendicular to the processing liquid as it flows in the radial direction across the first surface of the semiconductor substrate toward the periphery of the semiconductor substrate. When the processing liquid leaves the periphery of the semiconductor substrate, the method 200 detects the intensity of light transmitted through the processing liquid in step 230, and uses the intensity of light detected in step 230 to determine the localized fluid height of the processing liquid leaving the periphery, as discussed in more detail below.

A wide variety of methods may be used to determine the localized fluid height of the processing liquid at one or more radial positions based on the intensity of light detected at the one or more radial positions (in step 240). In some embodiments, the method 200 may determine the localized fluid height of the processing liquid in step 240 by: (a) monitoring the intensity of the light transmitted through the processing liquid at the one or more radial positions on the semiconductor substrate, as the processing liquid flows across the first surface of the semiconductor substrate and leaves the periphery of the semiconductor substrate; (b) detecting a difference in the intensity of light transmitted through the processing liquid at a given radial position on the semiconductor substrate, wherein the difference in the intensity of light corresponds to the localized fluid height of the processing liquid at the given radial position; and (c) utilizing the difference in the intensity of light to calculate the localized fluid height of the processing liquid at the given radial position.

In one example embodiment, the method 200 may use Beer-Lambert law to determine the localized fluid height of the processing liquid in step 240 based on the intensity of light detected in step 230. The Beer-Lambert law provides relationships between the transmittance, absorbance and optical path length of light traveling through a media. For non-scattering media having a single attenuating species of uniform concentration, the Beer-Lambert law is expressed as:

$$A = \log_{10}\left(\frac{1}{T}\right) = \log_{10}\left(\frac{I_0}{I}\right) = \varepsilon l c,$$

where "A" is the absorbance of the media, "T" is the transmittance through the media, "$I_0$" is the incident light intensity provided to the media, "I" is the intensity of light transmitted through the media, "ε" is the absorptivity of the attenuating species, "l" is the optical path length through the media and "c" is the concentration of the attenuating species. In the embodiments described herein, the incident light intensity ($I_0$), the absorptivity (ε) and the concentration (c) are known values. The intensity (I) of light transmitted through the processing liquid at one or more radial positions is detected in step 230. In some embodiments, method 200 may determine the optical path length (l) that the light traveled through the processing liquid (i.e., the localized fluid height (h) of the processing liquid) by inserting these values into the equation shown above.

The method 200 further includes determining a localized fluid velocity of the processing liquid at the one or more radial positions based on the localized fluid height of the processing liquid determined at the one or more radial positions (in step 250). Method 200 may utilize a wide variety of methods to determine the localized fluid velocity of the processing liquid in step 250 based on the localized fluid height of the processing liquid determined in step 240. In some embodiments, the localized fluid height of the processing liquid at two different radial positions can be used to determine the localized fluid velocity of the processing liquid between the radial positions by assuming conservation of mass and using Navier-Stokes equation (expressed, for example, in cylindrical coordinates for incompressible fluids). For example, the method 200 may use localized fluid heights calculated at two different radial positions (e.g., $p_1$ and $p_2$), and thus two different times (e.g., $t_1$ and $t_2$), to determine a volumetric change in the processing liquid that occurs over time ($\Delta t = t_2 - t_1$) between the radial positions ($\Delta p = p_2 - p_1$). The method 200 may then determine the localized fluid velocity of the processing liquid between the two radial positions that produces the volumetric change in the process liquid.

The method 200 further includes controlling one or more operational parameters of a spin-on process (in step 260) based on the localized fluid velocity of the processing liquid previously determined in step 250. For example, the method 200 may control the predetermined rotational speed at which the semiconductor substrate is rotated, the predetermined flow rate at which the processing liquid is dispensed, the position of a nozzle dispensing the processing liquid and/or the scan rate of the nozzle in step 250. By controlling one or more operational parameters of the spin-on process based on the localized fluid velocity of the processing liquid determined in step 250, method 200 avoids creating local fluid dynamics that could adversely affect local area performance of the substrate during spin processing.

Figure 3:
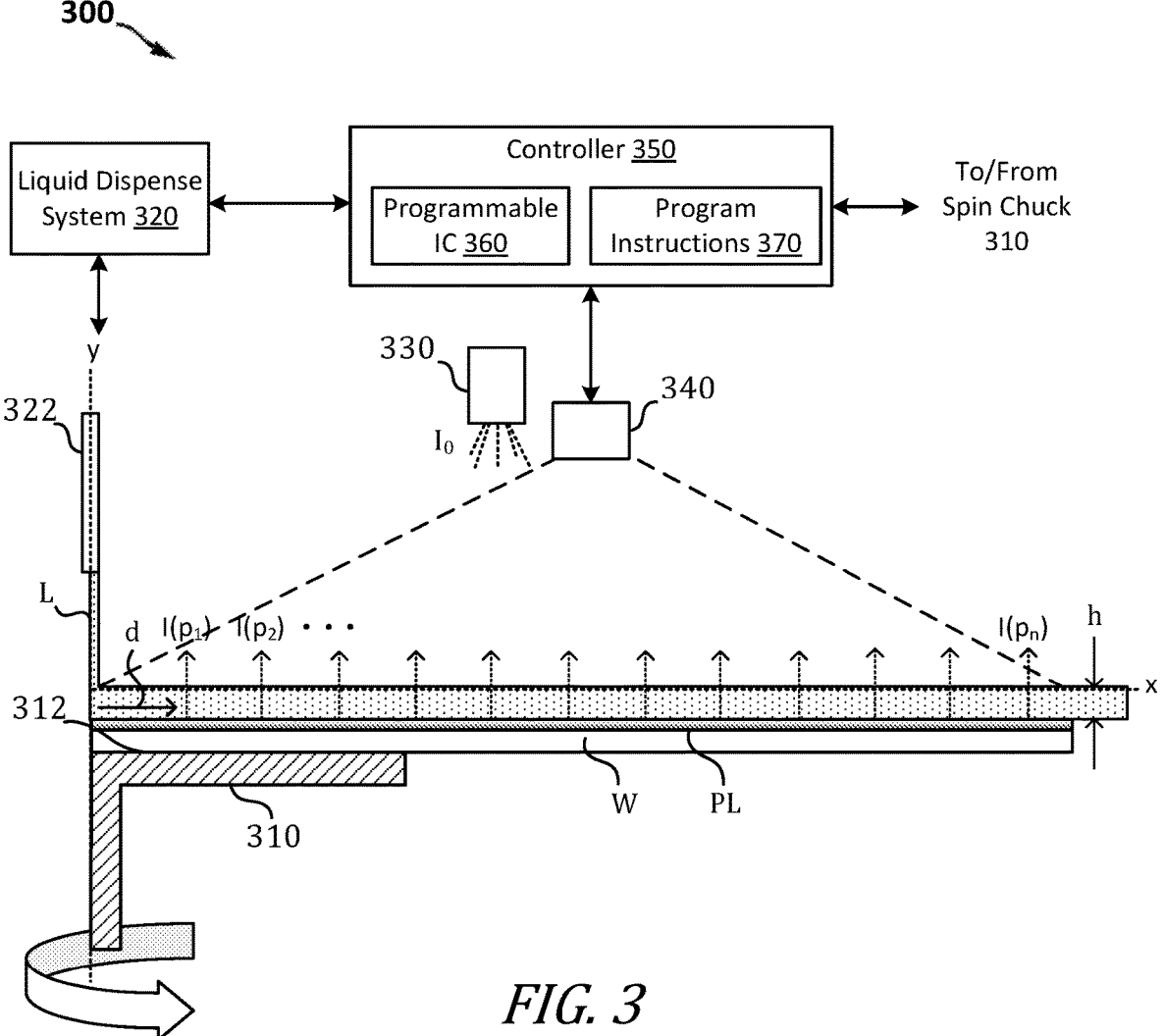
FIG. 3 is a block diagram illustrating a first embodiment of a processing system that utilizes the method shown in FIG. 2.
Figure 4:
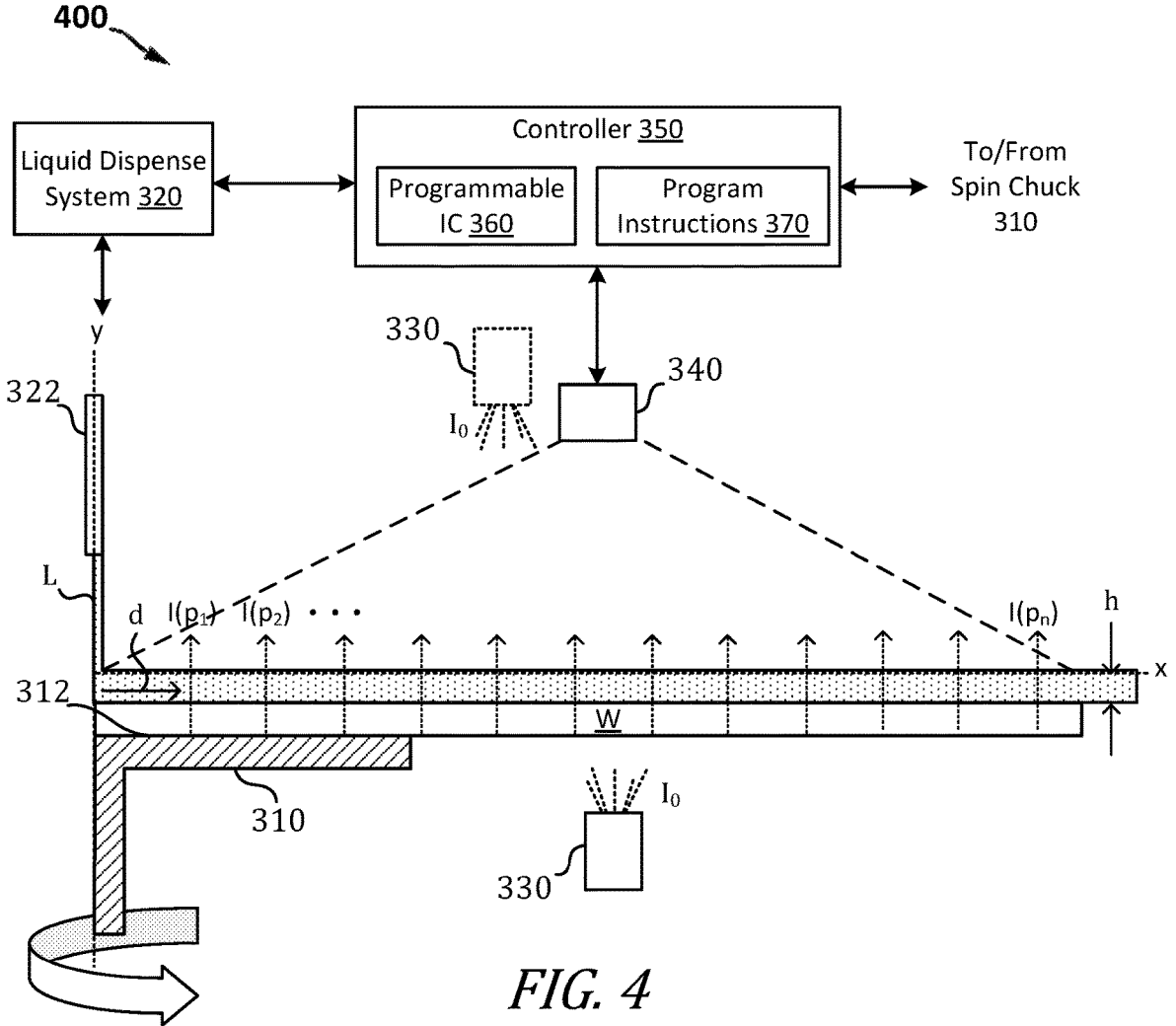
FIG. 4 is a block diagram illustrating a second embodiment of a processing system that utilizes the method shown in FIG. 2.
Figure 5:
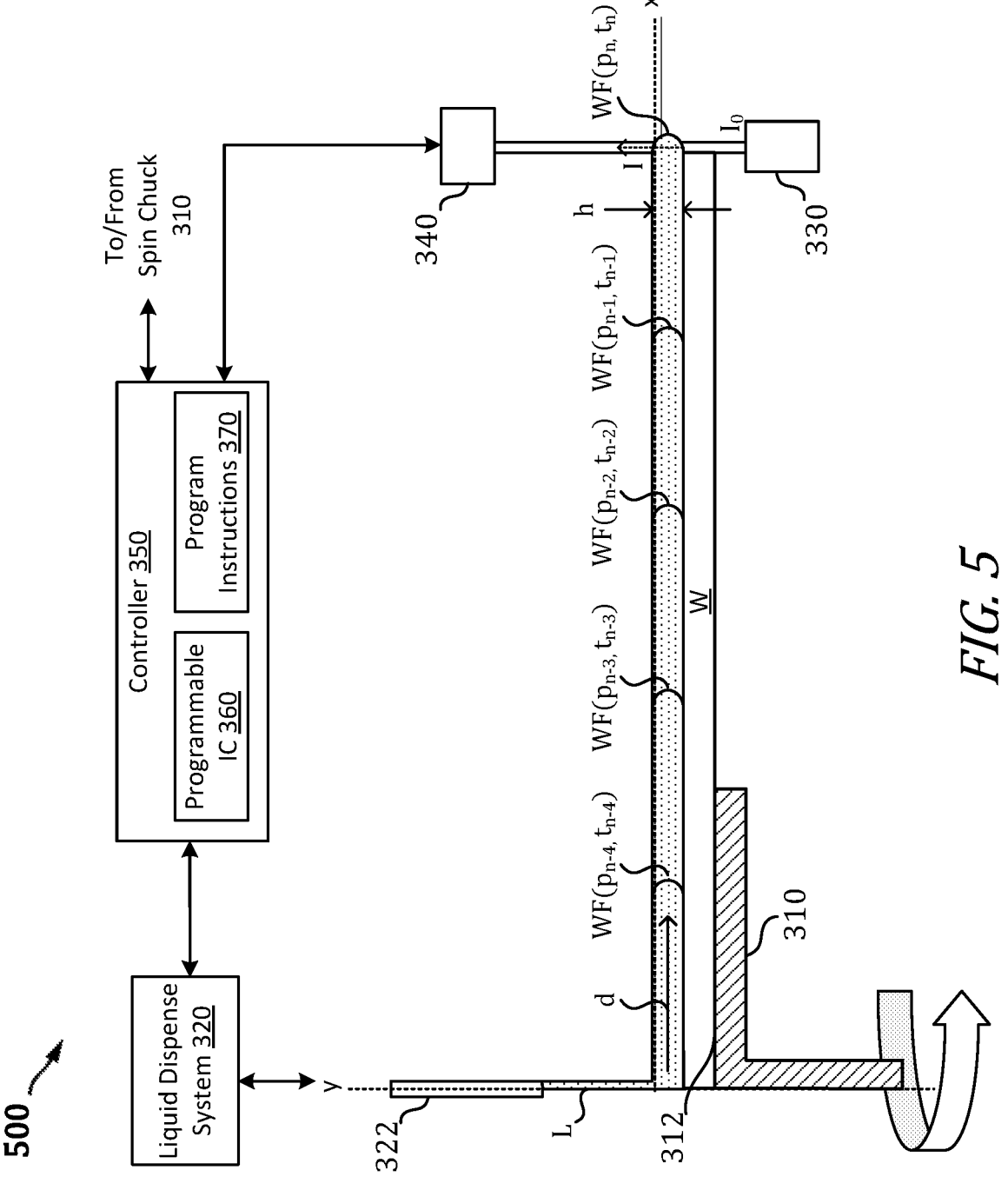
FIG. 5 is a block diagram illustrating a third embodiment of a processing system that utilizes the method shown in FIG. 2.

The method 200 shown in FIG. 2 may be performed within a wide variety of processing systems that perform spin processing. Various embodiments of example processing systems are shown in FIGS. 3-5 and described in more detail below. In each of the illustrated embodiments, the processing system includes a spin chuck 310, a liquid dispense system 320, a light source 330, an optical sensor 340 and a controller 350 having at least one programmable integrated circuit (IC) 360 for executing program instructions 370 stored within non-transitory memory. Although not depicted in the drawings, the processing systems shown in FIGS. 3-5 may include other hardware and software components, as is known in the art.

The spin chuck 310 has a support surface 312 for supporting a semiconductor substrate (W) and a drive mechanism (as shown, for example, in FIG. 1) for rotating the spin chuck 310 and the semiconductor substrate W mounted thereon at a predetermined rotational speed. The liquid dispense system 320 has at least one nozzle 322 for dispensing a processing liquid (L) onto a surface of the semiconductor substrate W while the semiconductor substrate is rotated by the spin chuck 310. Once dispensed, the processing liquid (L) flows in a radial direction (d) across the surface of the semiconductor substrate W toward a periphery of the substrate at an unknown fluid velocity.

The light source 330 can be configured to direct incident light ($I_0$) to an entirety of the semiconductor substrate W, a portion of the semiconductor substrate or along a periphery of the semiconductor substrate, as shown in FIGS. 3-5. The optical sensor 340 detects the intensity (I) of light transmitted through the processing liquid (L) as the processing liquid flows across the substrate surface or leaves the periphery of the substrate, and generates an output signal that is supplied to the controller 350. The controller 350 analyzes the output signal received from the optical sensor 340 to determine a localized fluid height (h) of the processing liquid (L) at one or more radial positions (p) on the semiconductor substrate W. Using the localized fluid height (h) determined at the one or more radial positions (p), the controller 350 determines a localized fluid velocity of the processing liquid (L) and uses the localized fluid velocity to control one or more operational parameters of a currently or subsequently performed spin-on process.

FIG. 3 illustrates one embodiment of a processing system 300 that utilizes the method 200 shown in FIG. 2. In the embodiment shown in FIG. 3, the optical sensor 340 is positioned above the semiconductor substrate W for detecting a photoluminescence (PL), which is emitted from the substrate surface and transmitted through the processing liquid (L) as the processing liquid flows across the surface of the semiconductor substrate W at the unknown fluid velocity.

In the processing system 300 shown in FIG. 3, the light source 330 is positioned above the semiconductor substrate W for directing incident light ($I_0$) to at least a portion of the substrate surface. The incident light ($I_0$) directed to the substrate surface excites a material exposed on the substrate surface, causing the material to auto-luminesce or produce photoluminescence (PL). The optical sensor 340 detects the intensity (I) of the photoluminescence (PL), which is transmitted through the processing liquid (L) at one or more radial positions (for example, $I(p_1)$, $I(p_2) \ldots I(p_n)$) on the semiconductor substrate W, as the processing liquid flows across the surface of the semiconductor substrate W at the unknown fluid velocity. The controller 350 uses the intensity (I) values detected by the optical sensor 340 to determine the localized fluid height (h) and/or the localized fluid velocity (v) of the processing liquid (L) at the one or more radiation positions (p).

A wide variety of light sources 330 may be utilized in the processing system 300 shown in FIG. 3. In some embodiments, the exposure hardware used to implement the light source 330 may expose an entirety of the semiconductor substrate W surface to an excitation wavelength, or range of wavelengths, as shown schematically in FIG. 3. In other embodiments, a pie slice or bar exposure system could be used to expose select portions of the semiconductor substrate W to the excitation wavelength(s) as the semiconductor substrate W is rotated by the spin chuck 310.

In the embodiment shown in FIG. 3, the light source 330 continuously exposes the substrate surface to the excitation wavelength(s), causing a material exposed on the substrate surface to produce photoluminescence (PL). The excitation wavelength(s) used by the light source 330 are generally chosen to excite the material that the processing liquid (L) is in contact with. For example, when a negative photoresist SU-8 material is provided on the surface of the semiconductor substrate W, the light source 330 may expose at least a portion of the substrate surface to an excitation wavelength of 365 nm. This excitation wavelength excites the negative photoresist SU-8 material, causing the photoresist material to produce photoluminescence around 460 nm, which is detected by the optical sensor 340. Other excitation wavelengths may be utilized by the light source 330 to excite other semiconductor materials (including, but not limited to, other photoresist materials) and produce photoluminescence within other wavelength(s) that can be detected by the optical sensor 340.

A wide variety of optical sensors 340 may be used in the processing system 300 shown in FIG. 3. For example, the optical sensor 340 can be implemented with a line scan camera having a 1-D pixel arrangement aligned in the radial direction (d), a series of photodiodes spaced along the radial direction (d), or a camera having a 2-D pixel array. Regardless of implementation, the optical sensor 340 is positioned above the substrate surface for detecting the intensity (I) of the photoluminescence (PL), which is produced by the material on the substrate surface and transmitted through the processing liquid (L) at the one or more radial positions (for example, $I(p_1)$, $I(p_2)$ . . . $I(p_n)$).

In some embodiments, fluorescent dyes can be added to the material matrix to increase the intensity (I) of photoluminescence (PL) detected by the optical sensor 340. Examples of fluorescent dyes include cyanates, such as fluorescein isothiocyanate (FITC), which emits at 517 nm when excited at 495 nm, and tetramethylrhodamine-5-(and 6)-isothiocyanate (TRITC), which emits at 573 nm when excited at 550 nm. In some embodiments, colloidal metal nanoparticles (such as gold, silver or copper) that exhibit surface plasmon resonance can be added to the material matrix to increase sensitivity to fluorescence. Surface plasmons from nanoparticles increase fluorescence by enhancing the localized field around the fluorescent particle. Silver, for example, emits around the 450 nm wavelength but excitation depends on colloidal particle size. While the introduction of nanoparticles increases fluorescence, adding metals into the processing liquid may lead to contamination risks. As such, this method is more likely to be used during a testing phase to provide useful information for optimization and modeling.

The intensity (I) values detected by the optical sensor 340 are provided to the controller 350 for further processing and analysis. In some embodiments, controller 350 may compare baseline values of intensity ($I_b(p_1)$, $I_b(p_2)$ . . . $I_b(p_n)$), which are produced by the material at the various radial positions (P) before the processing liquid (L) is dispensed (or during a static puddle process), to dynamic values of intensity ($I(p_1)$, $I(p_2)$ . . . $I(p_n)$), which are produced by the material and transmitted through the processing liquid (L) at the various radial positions (p) as the processing liquid flows across the surface of the semiconductor substrate W. Assuming the material provided on the substrate surface does not dissolve within the processing liquid (L), the optical path length (l) through the process liquid (L), and thus, the localized fluid height (h) of the process liquid can be determined by inserting a difference between the baseline values of intensity ($I_b(p_1)$, $I_b(p_2)$ . . . $I_b(p_n)$) and the dynamic values of intensity ($I(p_1)$, $I(p_2)$ . . . $I(p_n)$) into the Beer-Lambert law formula shown above. The localized fluid height of the process liquid can be similarly determined if the process liquid solvates the underlying material. In this case, however, dynamic values of intensity ($I(p_1)$, $I(p_2)$ . . . $I(p_n)$) are obtained from any remaining excited material once the dissolution process has reached an end point. In some embodiments, the controller 350 may use the localized fluid height (h) determined at two different radial positions (e.g., $p_1$ and $p_2$), and thus two different times (e.g., $t_1$ and $t_2$), to determine a volumetric change in the processing liquid (L) that occurs over time ($\Delta t = t_2 - t_1$) between the two radial positions ($\Delta p = p_2 - p_1$). The controller 350 may then determine the localized fluid velocity (v) of the processing liquid (L) between the two radial positions ($\Delta p = p_2 - p_1$) that produces the volumetric change in the process liquid.

The controller 350 may utilize the localized fluid velocity (v) in a wide variety of ways. In some embodiments, the controller 350 may utilize the localized fluid velocity (v) determined at one or more radial positions (p) to control operating parameter(s) of a current or subsequently performed spin-on process. For example, the controller 350 may determine that the rotational speed of the spin chuck 310 and/or the flow rate of the processing liquid (L) dispensed by the nozzle 322 should be adjusted to increase or decrease a fluid velocity of the processing liquid (L) across the substrate. In addition or alternatively, the controller 350 may determine that the scan position and/or the scan rate of the nozzle 322 should be adjusted to avoid deleterious local fluid dynamic effects in one or more areas of the substrate.

In other embodiments, the controller 350 may utilize the localized fluid height (h) and/or the localized fluid velocity (v) to determine additional information about the processing liquid and/or the process. For example, the controller 350 may use the localized fluid height (h) and/or the localized fluid velocity (v) determined at one or more locations, as well as simulation, to infer the liquid condition at other locations on the substrate (or earlier/later in the dispense process). In another example, the controller 350 may simulate/model a steady state dispense to determine the height of the processing liquid at a particular radial position (p) given the localized fluid velocity (v) at that radial position. In yet another example, the controller 350 may utilize the localized fluid height (h) and/or the localized fluid velocity (v) to determine the dynamic removal of the underlying material (if process fluid solvates the underlying material) and/or to determine when a constant steady state dispense condition is reached. In a further example, the controller 350 may combine information obtained during the process described above with other sensor data in a virtual metrology control scheme. For example, the controller 350 could combine the sensor data obtained by the optical sensor 340 with information obtained by other sensors (for example, dispense rate monitors, motor encoders, dispense nozzle "state" monitors) to determine the relationship of the sensor outputs to process performance (such as, for example, critical dimensions, CD).

FIG. 4 illustrates another embodiment of processing system 400 that utilizes the method 200 shown in FIG. 2. In the embodiment shown in FIG. 4, the optical sensor 340 is positioned above the semiconductor substrate W for detecting SWIR light, which is transmitted through the processing liquid (L) as the processing liquid flows across the surface of the semiconductor substrate W at the unknown fluid velocity.

In the processing system 400 shown in FIG. 4, the light source 330 is positioned below the semiconductor substrate W for directing SWIR light at an incident intensity ($I_0$) to a lower surface of the semiconductor substrate W. The SWIR light provided by the light source 330 is transmitted through the semiconductor substrate W and the processing liquid (L) as the processing liquid is dispensed onto an upper surface of the spinning substrate. The optical sensor 340 detects the intensity (I) of the SWIR light, which is transmitted through the semiconductor substrate W and the processing liquid (L) at one or more radial positions (for example, $I(p_1)$, $I(p_2)$ . . . $I(p_n)$) on the semiconductor substrate W, as the processing liquid flows across the upper surface of the semiconductor substrate W at the unknown fluid velocity.

In the embodiment shown in FIG. 4, the light source 330 and optical sensor 340 are positioned for transmission measurement. In other embodiments, the light source 330 and optical sensor 340 may be positioned for reflectometry measurement. When utilizing reflectometry, light source 330 may be arranged above the semiconductor substrate W for directing the SWIR light to the upper surface of the semiconductor substrate W (shown in dotted lines). In such embodiments, the optical sensor 340 may detect the intensity (I) of the SWIR light, which is reflected from the substrate surface and transmitted through the processing liquid (L) at the one or more radial positions (for example, $I(p_1)$, $I(p_2)$ . . . $I(p_n)$)) as the processing liquid is dispensed onto the spinning substrate.

A wide variety of light sources 330 and optical sensors 340 may be utilized in the processing system 400 shown in FIG. 4. For example, light source 330 may be a broadband SWIR light source or a narrowband SWIR light source having targeted spectral SWIR regions (achieved, for example, by using a narrow band SWIR light source and/or SWIR bandpass filters). The optical sensor 340 may include a variety of SWIR sensors and cameras such as, for example, an indium gallium arsenide (InGaAs) camera. In some embodiments, the optical sensor 340 can be implemented as a line scan SWIR camera having a 1-D pixel arrangement aligned in the radial direction (d), a series of SWIR photodiodes spaced along the radial direction (d), or a SWIR camera having 2-D pixel array.

The intensity (I) values detected by the optical sensor 340 are provided to the controller 350 for further processing and analysis. In some embodiments, the controller 350 may use the intensity (I) values detected by the optical sensor 340 to determine the localized fluid height (h) and/or the localized fluid velocity (v) of the processing liquid (L) at the one or more radiation positions (p). In one example embodiment, the controller 350 may determine the localized fluid height (h) of the process liquid (L) at one or more of the radial positions (p) on the substrate by inserting the incident intensity ($I_0$) of SWIR light provided by the light source 330 and the intensity (I) of SWIR light detected by the optical sensor 340 into the Beer-Lambert law formula shown above. Because SWIR wavelength(s) are absorbed primarily by the processing liquid, and not the substrate material(s), the optical attenuation (decrease in intensity) is due primarily to the absorbance of the processing liquid, which is directly proportional to the optical path length (l) through the process liquid, and thus, the localized fluid height (h) of the process liquid. In some embodiments, the controller 350 may use the localized fluid height (h) determined at two different radial positions (e.g., $p_1$ and $p_2$), and thus two different times (e.g., $t_1$ and $t_2$), to determine a volumetric change in the processing liquid (L) that occurs over time ($\Delta t = t_2 - t_1$) between the two radial positions ($\Delta p = p_2 - p_1$). The controller 350 may then determine the localized fluid velocity (v) of the processing liquid (L) between the two radial positions ($\Delta p = p_2 - p_1$) that produces the volumetric change in the process liquid.

The controller 350 may utilize the localized fluid velocity (v) in a wide variety of ways. In some embodiments, the controller 350 may utilize the localized fluid velocity (v) determined at one or more radial positions (p) to control operating parameter(s) of a current or subsequently performed spin-on process. For example, the controller 350 may determine that the rotational speed of the spin chuck 310 and/or the flow rate of the processing liquid (L) dispensed by the nozzle 322 should be adjusted to increase or decrease a fluid velocity of the processing liquid (L) across the substrate. In addition or alternatively, the controller 350 may determine that the scan position and/or the scan rate of the nozzle 322 should be adjusted to avoid deleterious local fluid dynamic effects in one or more areas of the substrate.

In other embodiments, the controller 350 may utilize the localized fluid height (h) and/or the localized fluid velocity (v) to determine additional information about the processing liquid and/or the process. For example, the controller 350 may combine the sensor data obtained by the optical sensor

340 with information obtained by other sensors (for example, dispense rate monitors, motor encoders, dispense nozzle "state" monitors) to determine the relationship of the sensor outputs to process performance (such as, for example, critical dimensions, CD).

In some embodiments, the SWIR wavelength(s) emitted by the light source 330 and the frame rate used by the optical sensor 340 may be selected based on the chemical species that the system is monitoring the light absorbance of. Example chemical species include, but are not limited to: (1) a chemical species in a developer solution, (2) a species in an undeveloped resist, and (3) a reaction product that is created as a resist develops and goes into solution. Monitoring a chemical species in a develop solution can be used for direct measurement of fluid height, since the changes in intensity detected by the optical sensor 340 relate to differences in the fluid height of the process liquid at a given radial position. When utilized for height monitoring, the optical sensor 340 may be a SWIR camera having a frame rate of approximately 30 frames per second (fps). Monitoring a species in the undeveloped resist and/or a reaction product that is created as the resist develops and goes into solution could facilitate monitoring of the dynamic dissolution of the resist if the frame rate is high enough. When utilized for dissolution monitoring, a SWIR camera having a higher frame rate (for example, 100 fps or higher) may be used.

In some embodiments, the processing system 400 shown in FIG. 4 may be used to monitor multiple chemical species and wavelengths, as such monitoring can provide useful information about non-uniformities in critical dimension (CD). For example, choosing to monitor a species in the undeveloped resist and/or a reaction product that is created as the resist develops and goes into solution can provide indirect ways to monitor problems with non-uniform CD which are caused by non-uniform fluid dynamics.

FIG. 5 illustrates yet another embodiment of a processing system 500 that utilizes the method 200 shown in FIG. 2. In the embodiment shown in FIG. 5, the light source 330 and optical sensor 340 are positioned near a periphery of the semiconductor substrate W for monitoring the intensity (I) of a focused beam of light, which is transmitted through the processing liquid (L) as the processing liquid leaves the periphery of the semiconductor substrate. A wide variety of light sources 330 and optical sensors 340 can be utilized in the processing system 500 shown in FIG. 5. In one example, light source 330 and optical sensors 340 may be a visible wavelength laser beam and sensor, respectively.

In the processing system 500 shown in FIG. 5, the light source 330 directs a focused beam of light at an incident intensity ($I_0$) along the periphery of the semiconductor substrate W, as the processing liquid (L) is dispensed onto the surface of the spinning substrate. Once dispensed, an expanding wave front (WF) of the processing liquid (L) travels in a radial direction (d) across the surface of the semiconductor substrate W towards the periphery of the substrate at an unknown fluid velocity. The optical sensor 340 detects the intensity (I) of the focused beam of light, which is transmitted through the processing liquid (L) as the processing liquid leaves the periphery of the semiconductor substrate. Since the light source 330 and optical sensor 340 are positioned near the periphery of the semiconductor substrate, the optical sensor 340 detects the light intensity ($I(p_n)$), which is transmitted through the processing liquid (L) at the periphery or furthest radial position ($p_n$).

The intensity ($I(p_n)$) detected by the optical sensor 340 is provided to the controller 350 for further processing and analysis. In some embodiments, the controller 350 may use the intensity ($I(p_n)$)) detected by the optical sensor 340 to determine the localized fluid height (h) and/or the localized fluid velocity (v) of the processing liquid (L) at the periphery or furthest radial position ($p_n$). In one example embodiment, the controller 350 may determine the localized fluid height (h) of the process liquid (L) at the radial position ($p_n$) on the substrate by inserting the incident intensity ($I_0$) provided by the light source 330 and the light intensity ($I(p_n)$) detected by the optical sensor 340 into the Beer-Lambert law formula shown above. Since the focused beam of light only passes the processing liquid in the embodiment shown in FIG. 5, the optical attenuation (decrease in intensity) is due to the absorbance of the processing liquid, which is directly proportional to the optical path length (l) through the process liquid, and thus, the localized fluid height (h) of the process liquid at the periphery.

In some embodiments, the controller 350 may use the localized fluid height (h) determined at the radial position ($p_n$) to determine the localized fluid velocity (v) of the processing liquid (L) at the radial position ($p_n$) by assuming conservation of mass and using Navier-Stokes equation, as described above. In some embodiments, the controller 350 may use the fluid height over time to determine an average fluid velocity ($v_{ave}$) of the processing liquid (L) across the substrate surface at a given rotational speed.

Once the fluid velocity is determined, the controller 350 may utilize the fluid velocity in a wide variety of ways. In some embodiments, the controller 350 may utilize the localized fluid velocity (v) determined at the radial position ($p_n$) or the average fluid velocity ($v_{ave}$) across the substrate surface to control operating parameter(s) of a current or subsequently performed spin-on process. For example, the controller 350 may determine that the rotational speed of the spin chuck 310 and/or the flow rate of the processing liquid (L) dispensed by the nozzle 322 should be adjusted to increase or decrease a fluid velocity of the processing liquid (L) across the substrate. In addition or alternatively, the controller 350 may determine that the scan position and/or the scan rate of the nozzle 322 should be adjusted to avoid deleterious local fluid dynamic effects in one or more areas of the substrate.

In other embodiments, the controller 350 may utilize the localized fluid height (h) and/or the localized or average fluid velocity to determine additional information about the processing liquid and/or the process. For example, the controller 350 may combine the sensor data obtained by the optical sensor 340 with information obtained by other sensors (for example, dispense rate monitors, motor encoders, dispense nozzle "state" monitors) to determine the relationship of the sensor outputs to process performance (such as, for example, critical dimensions, CD). In another example, the controller 350 may use the localized fluid height (h) determined at the periphery of the substrate, as well as simulation, to infer the liquid condition at other locations on the substrate (or earlier/later in the dispense process). In yet another example, the controller 350 may simulate/model a steady state dispense to determine a localized fluid velocity of the processing liquid at a particular radial position on the substrate surface. The steady state dispense model result can also be used to determine a dynamic fluid height of the processing liquid at the particular radial position.

FIG. 6 illustrates another embodiment of a method 600 in accordance with the present disclosure. Like the method 200 shown in FIG. 2, the method 600 shown in FIG. 6 can be used to determine a fluid velocity of a processing liquid dispensed onto a surface of a spinning semiconductor substrate and control operational parameters of a spin-on process based on the localized fluid velocity. Unlike the method 200, however, the method 600 determines an average fluid velocity of the processing liquid on the spinning semiconductor substrate by monitoring the amount of time it takes for the processing liquid to flow from a dispensed location to the periphery of the semiconductor substrate.

The method 600 shown in FIG. 6 may determine the average fluid velocity offline during a testing phase, or dynamically while performing a spin-on process to process a semiconductor substrate. In some embodiments, the average fluid velocity is determined during an initial testing phase to determine an optimum process recipe for processing a semiconductor substrate during a subsequently performed spin-on process. In other embodiments, the average fluid velocity is determined dynamically during a spin-on process and used to adjust the process recipe in real-time as the semiconductor substrate is being processed.

In some embodiments, the method 600 may begin (in step 610) by dispensing a processing liquid onto a dispensed location on a surface of a semiconductor substrate while the semiconductor substrate is rotated at a predetermined rotational speed (for example, a rotational speed within a range of 200 to 3000 rotations per minute, RPM). Although the processing liquid is dispensed at a predetermined flow rate, the processing liquid flows from the dispensed location in a radial direction across the surface of the semiconductor substrate toward a periphery of the semiconductor substrate at an unknown fluid velocity, as discussed above.

Figure 7:
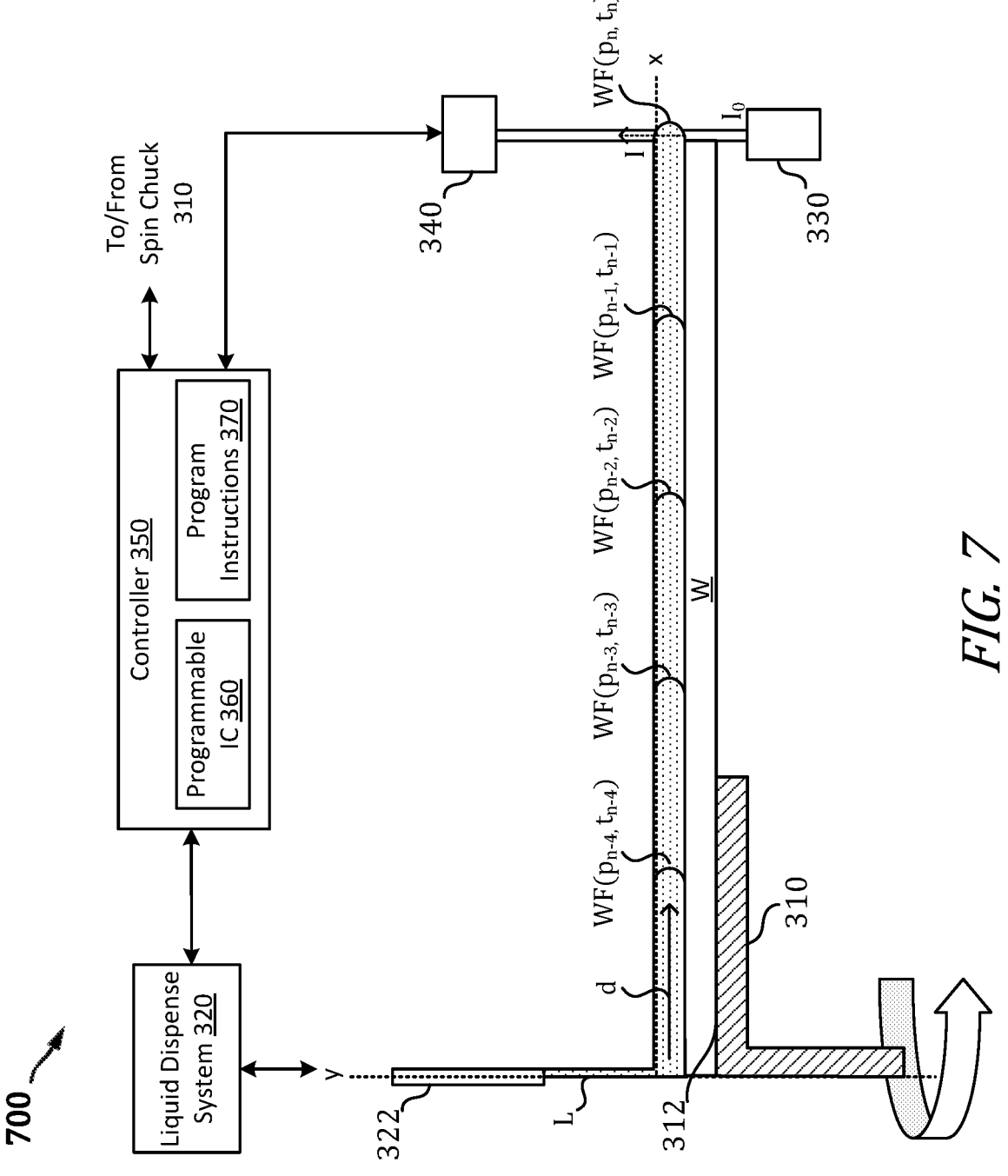
FIG. 7 is a block diagram illustrating a first embodiment of a processing system that utilizes the method shown in FIG. 6.
Figure 8:
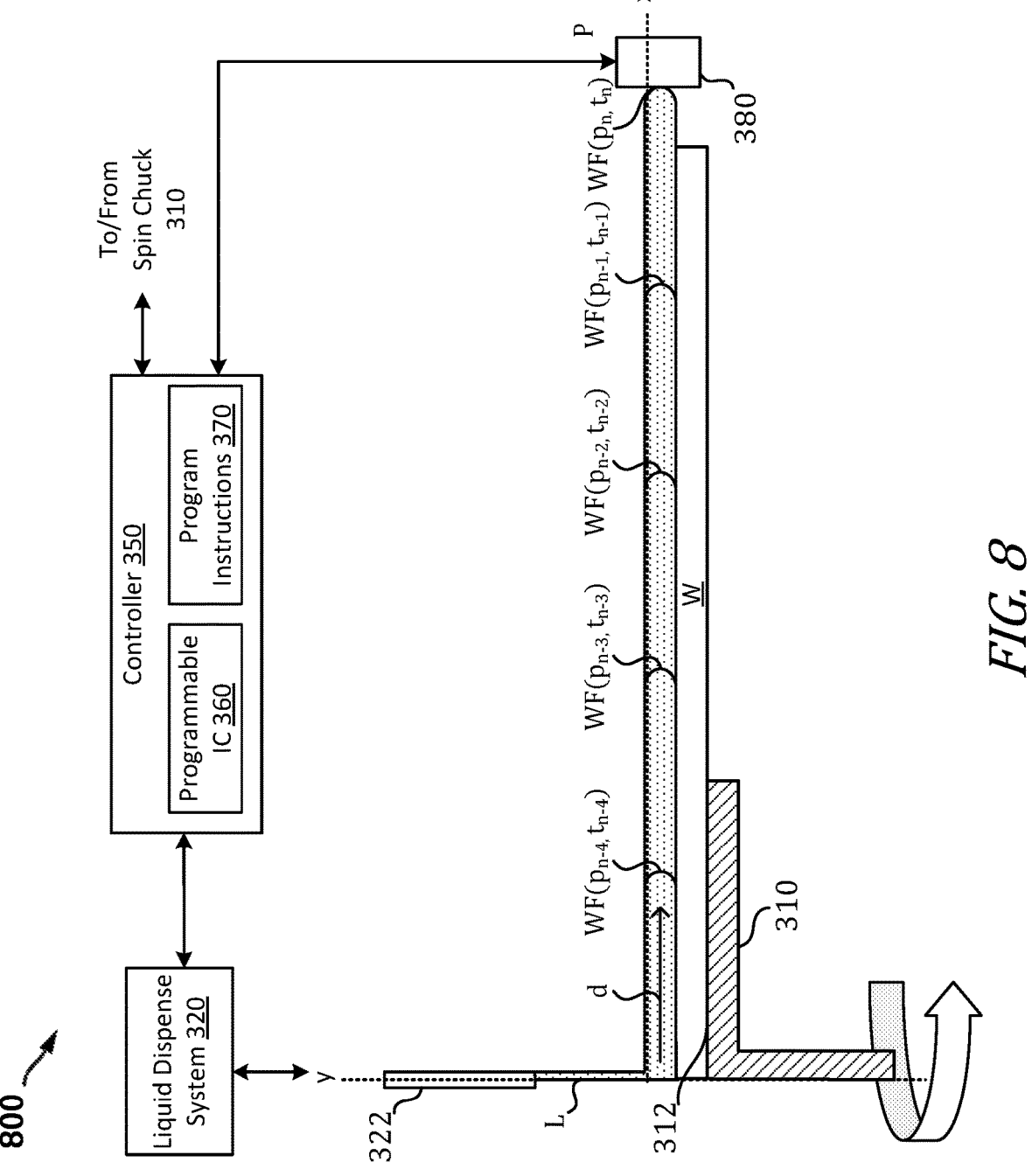
FIG. 8 is a block diagram illustrating a second embodiment of a processing system that utilizes the method shown in FIG. 6.

The method 600 further includes monitoring a sensor output signal obtained from a sensor, which is positioned adjacent to the periphery of the semiconductor substrate and perpendicular to the processing liquid as it flows in the radial direction across the surface of the semiconductor substrate toward the periphery of the semiconductor substrate (in step 620). The sensor may be an optical sensor (as shown in FIG. 7) or a pressure sensor (as shown in FIG. 8). The method 600 further includes determining an amount of time it takes for the processing liquid to flow from the dispensed location to the periphery of the semiconductor substrate based on the sensor output signal (in step 630), and determining an average fluid velocity of the processing liquid across the surface of the semiconductor substrate based on the amount of time it takes for the processing liquid to flow from the dispensed location to the periphery of the semiconductor substrate (in step 640).

In some embodiments, the method 600 monitors the sensor output signal in step 620 by: (a) monitoring the sensor output signal generated by the sensor over time, as the processing liquid flows from the dispensed location in the radial direction across the surface of the semiconductor substrate toward the periphery of the semiconductor substrate, and (b) detecting a change in the sensor output signal when the processing liquid leaves the periphery of the semiconductor substrate. In such embodiments, the method 600 may determine the amount of time it takes for the processing liquid to flow from the dispensed location to the periphery of the semiconductor substrate in step 630 by determining the amount of time between an initial dispensing of the processing liquid and detecting the change in the sensor output signal.

In some embodiments, the method 600 may determine the average fluid velocity of the processing liquid in step 640 based on the predetermined rotational speed, the predetermined flow rate and the amount of time it takes for the processing liquid to flow from the dispensed location to the periphery of the semiconductor substrate. This method may be used when an optical sensor or a pressure sensor is utilized to generate the sensor output signal. When a pressure sensor is utilized to generate the sensor output signal, the method 600 may also determine the average fluid velocity of the processing liquid in step 640 based on the predetermined rotational speed, the predetermined flow rate and the pressure of the processing liquid detected by the pressure sensor when the processing liquid leaves the periphery of the semiconductor substrate. In some embodiments, the method 600 may use the number of vertical pixels of the pressure sensor that detect the pressure of the processing liquid to determine the fluid height of the processing liquid at the periphery of the substrate.

The method 600 further includes controlling one or more operational parameters of a spin-on process (in step 650) based on the average fluid velocity of the processing liquid previously determined in step 640. For example, the method 600 may control the predetermined rotational speed at which the semiconductor substrate is rotated, the predetermined flow rate at which the processing liquid is dispensed, the position of a nozzle dispensing the processing liquid and/or the scan rate of the nozzle in step 650. By controlling one or more operational parameters of the spin-on process based on the average fluid velocity of the processing liquid determined in step 640, method 600 avoids creating local fluid dynamics that could adversely affect local area performance of the substrate during spin processing.

The method 600 shown in FIG. 6 may be performed within a wide variety of processing systems that perform spin processing. Various embodiments of example processing systems are shown in FIGS. 7-8 and described in more detail below.

FIG. 7 illustrates one embodiment of a processing system 700 that utilizes the method 600 shown in FIG. 6. Like the previous embodiments shown in FIGS. 3-5, the processing system 700 shown in FIG. 7 includes a spin chuck 310, a liquid dispense system 320, a light source 330, an optical sensor 340 and a controller 350 having at least one programmable integrated circuit (IC) 360 for executing program instructions 370 stored within non-transitory memory. Unlike the previous embodiments, however, the light source 330 and optical sensor 340 shown in FIG. 7 are positioned near the periphery of the semiconductor substrate W to monitor the amount of time it takes for an expanding wave front (WF) of the processing liquid (L) to leave the periphery of the spinning semiconductor substrate.

In the processing system 700 shown in FIG. 7, the nozzle 322 dispenses a processing liquid (L) onto a dispensed location on the surface of the semiconductor substrate W (for example, near the center of the substrate), while the substrate is rotated at a predetermined rotational speed. The light source 330 directs a focused beam of light (for example, a visible wavelength laser beam) at an incident intensity $(I_0)$ along the periphery of the semiconductor substrate W, as the processing liquid (L) is dispensed onto the surface of the spinning substrate. Once dispensed from the nozzle 322, an expanding wave front (WF) of the processing liquid (L) travels from the dispensed location in a radial direction (d) across the surface of the semiconductor substrate W towards the periphery of the substrate at an unknown fluid velocity. When the expanding wave front (WF) reaches the periphery of the semiconductor substrate and passes through the focused beam of light provided by the light source 330, the optical sensor 340 detects an abrupt change or decrease in the intensity (I) of the focused beam of light. Since the light source 330 and optical sensor 340 are positioned near the periphery of the semiconductor substrate, the optical sensor 340 detects the change in the light intensity $(I(p_n))$ that occurs at the periphery or furthest radial position $(p_n)$ on the substrate at the time $(t_n)$ when the processing liquid leaves the surface of the spinning substrate, and generates a sensor output signal in response thereto.

The sensor output signal generated by the optical sensor 340 is provided to the controller 350 for further processing and analysis. In some embodiments, the controller 350 determines the average fluid velocity $(v_{ave})$ of the processing liquid (L) at the periphery of the semiconductor substrate W based on the amount of time $(t_n)$ it takes for the optical sensor 340 to detect the change in light intensity $(I(p_n))$ after the initial dispense of the processing liquid. In other embodiments, the controller 350 may determine the average fluid velocity $(v_{ave})$ of the processing liquid (L) based on the predetermined rotational speed of the spin chuck 310, the predetermined flow rate of the processing liquid dispensed by the nozzle 322 and the time $(t_n)$.

FIG. 8 illustrates another embodiment of a processing system 800 that utilizes the method 600 shown in FIG. 6. Like the previous embodiments shown in FIGS. 3-5 and 7, the processing system 800 shown in FIG. 8 includes a spin chuck 310, a liquid dispense system 320 and a controller 350 having at least one programmable integrated circuit (IC) 360 for executing program instructions 370 stored within non-transitory memory. However, the processing system 800 differs from the previous embodiments shown in FIGS. 3-5 and 7 by including a pressure sensor 380 instead of the light source 330 and optical sensor 340.

In the processing system 800 shown in FIG. 8, the pressure sensor 380 is positioned near the periphery of the semiconductor substrate W to monitor the amount of time it takes for the expanding wave front (WF) of the processing liquid (L) to leave the periphery of the spinning semiconductor substrate. In one embodiment, the pressure sensor 380 may be positioned within (or on a surface of) a spin cup, such as the spin cup 130 shown in FIG. 1. However, the pressure sensor 380 is not strictly limited to such an arrangement and may be alternatively positioned on/within other nearby structures for detecting the impact force or pressure of the processing liquid as it is ejected from the periphery of the spinning semiconductor substrate.

In the processing system 800 shown in FIG. 8, the nozzle 322 dispenses a processing liquid (L) onto a dispensed location on the surface of the semiconductor substrate W (for example, near the center of the substrate), while the substrate is rotated at a predetermined rotational speed. The pressure sensor 380 monitors the pressure (P) near the periphery of the semiconductor substrate W, as the processing liquid (L) is dispensed onto the surface of the spinning substrate. Once dispensed from the nozzle 322, an expanding wave front (WF) of the processing liquid (L) travels from the dispensed location in a radial direction (d) across the surface of the semiconductor substrate W towards the periphery of the substrate at an unknown fluid velocity. When the expanding wave front (WF) leaves the periphery of the semiconductor substrate, the pressure sensor 380 detects an abrupt change or increase in the pressure (P) detected by the pressure sensor 380, due to the impact force of the processing liquid on the pressure sensor 380 as it is ejected from the periphery of the spinning substrate. By positioning the pressure sensor 380 near the periphery of the semiconductor substrate, the pressure sensor 380 detects the change in pressure (P) that occurs at the periphery or furthest radial position $(p_n)$ on the substrate at the time $(t_n)$ when the processing liquid leaves the surface of the spinning substrate, and generates a sensor output signal in response thereto.

The sensor output signal generated by the pressure sensor 380 is provided to the controller 350 for further processing and analysis. In some embodiments, the controller 350 may analyze the sensor output signal to detect: 1) a change in state (for example, liquid/no liquid) to determine the initial timing of the expanding wave front of the process liquid ejected from the periphery of the substrate, 2) a fluid height of the processing liquid upon exiting the substrate by interpretation of the 1-D height of pressure disturbance on the pressure sensor 380, and/or 3) a radial velocity of the processing liquid upon exiting the substrate by interpretation (for example, max or average) of the pressure disturbance on the pressure sensor 380.

In some embodiments, the controller 350 may determine the average fluid velocity ($v_{ave}$) of the processing liquid (L) at the periphery of the semiconductor substrate W based on the amount of time ($t_n$) it takes for the pressure sensor 380 to detect the change in pressure (P) after the initial dispense of the processing liquid. In other embodiments, the controller 350 may determine the average fluid velocity ($v_{ave}$) of the processing liquid (L) at the periphery of the semiconductor substrate W based on the predetermined rotational speed of the spin chuck 310, the predetermined flow rate of the processing liquid dispensed by the nozzle 322 and the pressure (P) detected by the pressure sensor 380 when the processing liquid leaves the periphery of the semiconductor substrate W. In some embodiments, the controller 350 may also determine a fluid height of the processing liquid when the processing liquid leaves the periphery of the semiconductor substrate W. For example, the controller 350 may use the number of vertical pixels of the pressure sensor 380 that sense the pressure (P) differential to approximate the fluid height of the processing liquid at the periphery of the semiconductor substrate W.

The controller 350 shown in FIGS. 7 and 8 may utilize the timing of the processing liquid leaving the substrate, the fluid height of the processing liquid upon leaving the substrate and/or the average fluid velocity ($v_{ave}$) of the processing liquid in a wide variety of ways. In some embodiments, the controller 350 may utilize the average fluid velocity ($v_{ave}$) of the processing liquid to control operating parameter(s) of a current or subsequently performed spin-on process. For example, the controller 350 may determine that the rotational speed of the spin chuck 310 and/or the flow rate of the processing liquid (L) dispensed by the nozzle 322 should be adjusted to increase or decrease the fluid velocity of the processing liquid (L) across the substrate. In addition or alternatively, the controller 350 may determine that the scan position and/or the scan rate of the nozzle 322 should be adjusted to avoid deleterious local fluid dynamic effects in one or more areas of the substrate.

In other embodiments, the controller 350 may utilize the timing of the processing liquid leaving the substrate, the fluid height of the processing liquid upon leaving the substrate and/or the average fluid velocity ($v_{ave}$) of the processing liquid to determine additional information about the processing liquid and/or the process. For example, the controller 350 may combine one or more of the above-mentioned metrics with information obtained by other sensors (for example, dispense rate monitors, motor encoders, dispense nozzle "state" monitors) to determine the relationship of the sensor outputs to process performance (such as, critical dimensions, CD). In some embodiments, the controller 350 may combine one or more of the above-mentioned metrics with a simulation output such as, for example, a simulation library of different dispense/RPM/fluid permutations. In one example implementation, the controller 350 may use one or more of the above-mentioned metric(s), as well as simulation, to infer the liquid condition at other locations on the substrate (or earlier/later in the dispense process). In another example implementation, the controller 350 may simulate/model a steady state dispense to determine a localized fluid velocity of the processing liquid at a particular radial position on the substrate surface. The steady state dispense model result can also be used to determine a dynamic fluid height of the processing liquid at the particular radial position.

Systems and methods are provided herein for monitoring characteristics of a processing liquid dispensed onto a spinning substrate. The characteristics monitored by the embodiments disclosed herein include a localized or average fluid velocity and a localized or dynamic fluid height of the processing liquid dispensed onto a spinning substrate. A sensor (e.g., optical sensor 340 or pressure sensor 380) and controller (e.g., controller 350) are provided in each of the embodiments disclosed herein for monitoring the characteristics of the processing liquid dispensed onto the spinning substrate. The results of such monitoring may be used to control operating parameter(s) of a current or subsequently performed spin-on process, and/or to determine additional information about the processing liquid and/or the process, as discussed above. The monitoring results may also be used to predict process recipe changes that lead to optimization.

In some embodiments, for example, a method is provided herein for: 1) measuring the fluid height at different points on a substrate at the end of the dispense of a processing liquid, 2) determining the radial thickness profile through modeling and/or interpolation, 3) using the radial profile as the initial condition of a separate model that calculates the loss of thickness due to evaporation and/or centrifugal force, 4) measuring the final thickness profile, 5) finding which model parameters allow transformation from the initial condition to the final resist profile, and 6) using the model to predict process recipe changes that optimize the final dry thickness profile. These model parameters could include information that is not provided by the process liquid manufacturer, such as evaporation rate or solvent content. These model parameters could also include difficult to measure items, such as the coefficients or exponents of a viscosity model with solid content.

In other embodiments, a method is provided herein for: 1) measuring the fluid height at different points on a substrate at the end of the dispense of a processing liquid, 2) determining the radial thickness profile through modeling and/or interpolation, 3) measuring the mean CD dimension radially, 4) finding which model parameters allow transformation from the initial condition to the final CD profile, and 5) using the model to predict process recipe changes that optimize the final CD profile. The model parameters used in this method could include settings in commercially available develop models (such as, for example, the Mack model) or adjustable settings in a level-set model. They could also include parameters that connect fluid velocity, fluid height, or residence time to the develop model parameters using finite element simulation. The resulting model(s) could be used as a feedback uniformity control loop.

It is noted that the controller described herein can be implemented in a wide variety of manners. In one example, the controller 350 shown in FIGS. 3-5 and FIGS. 7-8 may be a computer. In another example, controller 350 may include at least one programmable integrated circuit 360 that is programmed with program instructions 370 to provide the functionality described herein. For example, the controller 350 may include one or more processors (such as a microprocessor, microcontroller, central processing unit, etc.), programmable logic devices (such as a complex programmable logic device (CPLD), field programmable gate array (FPGA), etc.), and/or other programmable integrated circuits can be programmed with software or other programming instructions to implement the functionality described herein for controller 350. It is further noted that the software or other programming instructions can be stored in one or more non-transitory computer-readable mediums (such as, e.g., memory storage devices, flash memory, dynamic random dom access memory (DRAM), reprogrammable storage devices, hard drives, floppy disks, DVDs, CD-ROMs, etc.), and the software or other programming instructions when executed by the programmable integrated circuits may cause the programmable integrated circuits to perform the processes, functions, and/or capabilities described herein. Other variations could also be implemented.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the systems and methods described herein will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for controlling one or more operational parameters of a spin-on process used to dispense a processing liquid onto a surface of a semiconductor substrate, the method comprising:

dispensing the processing liquid onto a first surface of the semiconductor substrate while the semiconductor substrate is rotated at a predetermined rotational speed, wherein the processing liquid is dispensed at a predetermined flow rate, and wherein the processing liquid flows in a radial direction across the first surface of the semiconductor substrate toward a periphery of the semiconductor substrate at an unknown fluid velocity;

directing light to the semiconductor substrate, or along the periphery of the semiconductor substrate, while the processing liquid is dispensed onto the first surface of the semiconductor substrate;

detecting an intensity of light transmitted through the processing liquid at one or more radial positions on the semiconductor substrate as the processing liquid flows across the first surface of the semiconductor substrate or leaves the periphery of the semiconductor substrate;

determining a localized fluid height of the processing liquid at the one or more radial positions based on the intensity of light detected at the one or more radial positions;

determining a localized fluid velocity of the processing liquid at the one or more radial positions based on the localized fluid height determined at the one or more radial positions; and controlling the one or more operational parameters of the spin-on process based on the localized fluid velocity of the processing liquid determined at the one or more radial positions.

2. The method of claim 1, wherein said directing light to the semiconductor substrate comprises:

directing an excitation wavelength of the light to at least a portion of the first surface of the semiconductor substrate, wherein the excitation wavelength excites a material on the first surface of the semiconductor substrate which causes the material to produce photoluminescence.

3. The method of claim 2, wherein said detecting the intensity of light transmitted through the processing liquid comprises:

detecting an intensity of the photoluminescence, which is produced by the material and transmitted through the processing liquid at the one or more radial positions on the semiconductor substrate as the processing liquid flows across the first surface of the semiconductor substrate.

4. The method of claim 1, wherein said directing light to the semiconductor substrate comprises:

directing short wave infrared (SWIR) light to at least a portion of a second surface of the semiconductor substrate, which opposes the first surface of the semiconductor substrate, wherein the SWIR light comprises a range of wavelengths that is transmitted through the semiconductor substrate and absorbed by the processing liquid.

5. The method of claim 4, wherein said detecting the intensity of light transmitted through the processing liquid comprises:

detecting an intensity of the SWIR light, which is transmitted through the semiconductor substrate and the processing liquid at the one or more radial positions on the semiconductor substrate as the processing liquid flows across the first surface of the semiconductor substrate.

6. The method of claim 1, wherein said directing light to the semiconductor substrate comprises:

directing a focused beam of light along the periphery of the semiconductor substrate, wherein the focused beam of light is directed perpendicular to the processing liquid as it flows in the radial direction across the first surface of the semiconductor substrate toward the periphery of the semiconductor substrate.

7. The method of claim 6, wherein said detecting the intensity of light transmitted through the processing liquid comprises:

detecting an intensity of the focused beam of light that is transmitted through the processing liquid as the processing liquid leaves the periphery of the semiconductor substrate.

8. The method of claim 1, wherein said determining the localized fluid height of the processing liquid comprises:

monitoring the intensity of light transmitted through the processing liquid at the one or more radial positions on the semiconductor substrate, as the processing liquid flows across the first surface of the semiconductor substrate and leaves the periphery of the semiconductor substrate;

detecting a difference in the intensity of light transmitted through the processing liquid at a given radial position on the semiconductor substrate, wherein the difference in the intensity of light corresponds to the localized fluid height of the processing liquid at the given radial position; and utilizing the difference in the intensity of light to calculate the localized fluid height of the processing liquid at the given radial position.

9. The method of claim 1, wherein said determining the localized fluid height of the processing liquid at the one or more radial positions comprises determining a first localized fluid height of the processing liquid at a first radial position based on an intensity of light detected at the first radial position and determining a second localized fluid height of the processing liquid at a second radial position based on an intensity of light detected at the second radial position, and wherein said determining the localized fluid velocity of the processing liquid comprises:

using the first localized fluid height and the second localized fluid height to determine a volumetric change in the processing liquid that occurs over time between the first radial position and the second radial position; and determining the localized fluid velocity of the processing liquid between the first radial position and the second radial position that produces the volumetric change in the process liquid.

10. The method of claim 1, wherein said controlling the one or more operational parameters of the spin-on process based on the localized fluid velocity of the processing liquid comprises controlling one or more of the following:

the predetermined rotational speed at which the semiconductor substrate is rotated;

the predetermined flow rate at which the processing liquid is dispensed;

a position of a nozzle dispensing the processing liquid; and a scan rate of the nozzle.

11. A method for controlling one or more operational parameters of a spin-on process used to dispense a processing liquid onto a surface of a semiconductor substrate, the method comprising:

dispensing the processing liquid onto a dispensed location on the surface of the semiconductor substrate while the semiconductor substrate is rotated at a predetermined rotational speed, wherein the processing liquid is dispensed at a predetermined flow rate, and wherein the processing liquid flows from the dispensed location in a radial direction across the surface of the semiconductor substrate toward a periphery of the semiconductor substrate at an unknown fluid velocity;

monitoring a sensor output signal obtained from a sensor, which is positioned adjacent to the periphery of the semiconductor substrate and perpendicular to the processing liquid as it flows in the radial direction across the surface of the semiconductor substrate toward the periphery of the semiconductor substrate;

determining an amount of time it takes for the processing liquid to flow from the dispensed location to the periphery of the semiconductor substrate based on the sensor output signal;

determining an average fluid velocity of the processing liquid across the surface of the semiconductor substrate based on the amount of time it takes for the processing liquid to flow from the dispensed location to the periphery of the semiconductor substrate; and controlling the one or more operational parameters of the spin-on process based on the average fluid velocity of the processing liquid.

12. The method of claim 11, further comprising directing a focused beam of light along the periphery of the semiconductor substrate, wherein the focused beam of light is directed perpendicular to the processing liquid as it flows in the radial direction across the surface of the semiconductor substrate toward the periphery of the semiconductor substrate.

13. The method of claim 12, wherein the sensor is an optical sensor, which is coupled to detect an intensity of the focused beam of light and generate the sensor output signal in response thereto, and wherein said monitoring the sensor output signal comprises:

monitoring the sensor output signal generated by the optical sensor over time as the processing liquid flows from the dispensed location in the radial direction across the surface of the semiconductor substrate toward the periphery of the semiconductor substrate; and detecting a change in the sensor output signal when the processing liquid leaves the periphery of the semiconductor substrate.

14. The method of claim 13, wherein said determining the amount of time it takes for the processing liquid to flow from the dispensed location to the periphery of the semiconductor substrate based on the sensor output signal comprises:

determining the amount of time between an initial dispensing of the processing liquid and detecting the change in the sensor output signal.

15. The method of claim 13, wherein said determining the average fluid velocity of the processing liquid across the surface of the semiconductor substrate comprises:

determining the average fluid velocity of the processing liquid across the surface of the semiconductor substrate based on the predetermined rotational speed, the predetermined flow rate and the amount of time it takes for the processing liquid to flow from the dispensed location to the periphery of the semiconductor substrate.

16. The method of claim 11, wherein the sensor is a pressure sensor, which is coupled to detect a pressure of the processing liquid when the processing liquid leaves the periphery of the semiconductor substrate and generate the sensor output signal in response thereto, and wherein said monitoring the sensor output signal comprises:

monitoring the sensor output signal generated by the pressure sensor over time as the processing liquid flows from the dispensed location in the radial direction across the surface of the semiconductor substrate toward the periphery of the semiconductor substrate; and detecting a change in the sensor output signal when the processing liquid leaves the periphery of the semiconductor substrate.

17. The method of claim 16, wherein said determining the amount of time it takes for the processing liquid to flow from the dispensed location to the periphery of the semiconductor substrate based on the sensor output signal comprises:

determining the amount of time between an initial dispensing of the processing liquid and detecting the change in the sensor output signal.

18. The method of claim 16, wherein said determining the average fluid velocity of the processing liquid further comprises:

determining the average fluid velocity of the processing liquid across the surface of the semiconductor substrate based on the predetermined rotational speed, the predetermined flow rate and the pressure of the processing liquid detected by the pressure sensor when the processing liquid leaves the periphery of the semiconductor substrate.

19. The method of claim 16, further comprising determining a fluid height of the processing liquid when the processing liquid leaves the periphery of the semiconductor substrate by determining a number of vertical pixels of the pressure sensor that detect the pressure of the processing liquid.

20. The method of claim 11, wherein said controlling the one or more operational parameters of the spin-on process based on the average fluid velocity of the processing liquid comprises controlling one or more of the following:

the predetermined rotational speed at which the semiconductor substrate is rotated;

the predetermined flow rate at which the processing liquid is dispensed;

a position of a nozzle dispensing the processing liquid; and a scan rate of the nozzle.

* * * * *